(12) United States Patent
Shin et al.

(10) Patent No.: US 12,040,320 B2
(45) Date of Patent: Jul. 16, 2024

(54) LIGHT EMITTING DIODE PANEL AND METHOD FOR MANUFACTURING THE LIGHT EMITTING DIODE PANEL

(71) Applicant: SAMSUNG ELECTRONICS CO., LTD., Suwon-si (KR)

(72) Inventors: Sangmin Shin, Suwon-si (KR); Hoseop Lee, Suwon-si (KR); Sangyoung Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 172 days.

(21) Appl. No.: 17/515,727

(22) Filed: Nov. 1, 2021

(65) Prior Publication Data

US 2022/0085266 A1     Mar. 17, 2022

Related U.S. Application Data

(63) Continuation of application No. 16/251,816, filed on Jan. 18, 2019, now Pat. No. 11,189,606.

(30) Foreign Application Priority Data

Jan. 29, 2018 (KR) ........................ 10-2018-0010895

(51) Int. Cl.
*H01L 25/16* (2023.01)
*H01L 25/075* (2006.01)
(Continued)

(52) U.S. Cl.
CPC ........ *H01L 25/167* (2013.01); *H01L 25/0753* (2013.01); *H01L 27/156* (2013.01);
(Continued)

(58) Field of Classification Search
CPC ....... H01L 2924/00014; H01L 2924/00; H01L 25/0753; H01L 2924/0002; H01L 2224/245
See application file for complete search history.

(56) References Cited

U.S. PATENT DOCUMENTS 7,554,646 B2   6/2009  Jang et al.
7,683,539 B2   3/2010  Kim et al.
(Continued)

FOREIGN PATENT DOCUMENTS

JP    2002-328313 A    11/2002
JP    5613400 B2       10/2014
(Continued)

OTHER PUBLICATIONS

International Search Report issued Apr. 16, 2019 by the International Searching Authority in International Patent Application No. PCT/KR2019/000498. (PCT/ISA/210).
(Continued)

*Primary Examiner* — Tony Tran
(74) *Attorney, Agent, or Firm* — Sughrue Mion, PLLC

(57) ABSTRACT

A light emitting diode (LED) panel is provided. The LED panel includes a thin-film transistor (TFT) backplane which includes an insulator film disposed on a top surface of a substrate, a plurality of organic films disposed on a top surface of the insulator film, and pixel electrodes disposed on a top surface of each of the plurality of organic films. The LED panel further includes a plurality of LEDs respectively bonded to the pixel electrodes disposed on the top surface of each of the plurality of organic films, wherein the plurality of organic films has the different heights according to a type of each of the plurality of LEDs respectively bonded to the pixel electrodes disposed on the top surface of each of the plurality of organic films.

7 Claims, 15 Drawing Sheets

(51) Int. Cl.
*H01L 27/15* (2006.01)
*H01L 27/12* (2006.01)
*H01L 33/62* (2010.01)

(52) U.S. Cl.
CPC ...... *H01L 27/1248* (2013.01); *H01L 27/1288* (2013.01); *H01L 33/62* (2013.01); *H01L 2933/0066* (2013.01)

(56) References Cited

U.S. PATENT DOCUMENTS

| | | |
|---|---|---|
| 9,029,880 B2 | 5/2015 | Sakariya et al. |
| 9,159,700 B2 | 10/2015 | Sakariya et al. |
| 9,178,123 B2 | 11/2015 | Sakariya et al. |
| 9,214,494 B2 | 12/2015 | Sakariya et al. |
| 9,343,448 B2 | 5/2016 | Sakariya et al. |
| 9,358,775 B2 | 6/2016 | Bower et al. |
| 9,368,683 B1 | 6/2016 | Meitl et al. |
| 9,434,150 B2 | 9/2016 | Bower et al. |
| 9,437,782 B2 | 9/2016 | Bower et al. |
| 9,444,015 B2 | 9/2016 | Bower et al. |
| 9,468,050 B1 | 10/2016 | Rotzoll et al. |
| 9,520,537 B2 | 12/2016 | Bower et al. |
| 9,537,069 B1 | 1/2017 | Bower et al. |
| 9,550,353 B2 | 1/2017 | Bower et al. |
| 9,559,142 B2 | 1/2017 | Sakariya et al. |
| 9,601,356 B2 | 3/2017 | Bower et al. |
| 9,620,487 B2 | 4/2017 | Sakariya et al. |
| 9,640,108 B2 | 5/2017 | Cok et al. |
| 9,640,715 B2 | 5/2017 | Bower et al. |
| 9,698,308 B2 | 7/2017 | Bower et al. |
| 9,704,821 B2 | 7/2017 | Meitl et al. |
| 9,705,042 B2 | 7/2017 | Bower et al. |
| 9,741,785 B2 | 8/2017 | Bower et al. |
| 9,741,784 B2 | 9/2017 | Bower et al. |
| 9,799,719 B2 | 10/2017 | Cok |
| 9,799,794 B2 | 10/2017 | Bower et al. |
| 9,818,725 B2 | 11/2017 | Bower et al. |
| 9,899,465 B2 | 2/2018 | Bower et al. |
| 9,929,053 B2 | 3/2018 | Bower et al. |
| 9,947,584 B2 | 4/2018 | Bower et al. |
| 9,991,163 B2 | 6/2018 | Bower et al. |
| 9,991,413 B2 | 6/2018 | Bower et al. |
| 9,991,423 B2 | 6/2018 | Bower et al. |
| 9,997,100 B2 | 6/2018 | Rotzoll |
| 10,043,784 B2 | 8/2018 | Sakariya et al. |
| 10,074,768 B2 | 9/2018 | Meitl et al. |
| 10,109,764 B2 | 10/2018 | Bower et al. |
| 10,133,426 B2 | 11/2018 | Den Boer et al. |
| 2011/0115055 A1 | 5/2011 | Niide et al. |
| 2014/0367705 A1 | 12/2014 | Bibl et al. |
| 2015/0311415 A1 | 10/2015 | Song et al. |
| 2015/0371585 A1 | 12/2015 | Bower et al. |
| 2015/0371974 A1 | 12/2015 | Bower et al. |
| 2016/0018094 A1 | 1/2016 | Bower et al. |
| 2016/0020127 A1 | 1/2016 | Bower et al. |
| 2016/0020131 A1 | 1/2016 | Bower et al. |
| 2016/0093600 A1 | 3/2016 | Bower et al. |
| 2016/0294162 A1 | 10/2016 | McLaurin et al. |
| 2016/0351539 A1 | 12/2016 | Bower et al. |
| 2017/0025399 A1 | 1/2017 | Takeya et al. |
| 2017/0047303 A1 | 2/2017 | Meitl et al. |
| 2017/0048976 A1 | 2/2017 | Prevatte et al. |
| 2017/0069611 A1 | 3/2017 | Zhang et al. |
| 2017/0102797 A1 | 4/2017 | Cok |
| 2017/0103964 A1 | 4/2017 | Bower et al. |
| 2017/0122502 A1 | 5/2017 | Cok et al. |
| 2017/0133818 A1 | 5/2017 | Cok |
| 2017/0173852 A1 | 6/2017 | Moore et al. |
| 2017/0179097 A1 | 6/2017 | Zhang et al. |
| 2017/0179192 A1 | 6/2017 | Zhang et al. |
| 2017/0206820 A1 | 7/2017 | Cok et al. |
| 2017/0207193 A1 | 7/2017 | Bower et al. |
| 2017/0236811 A1 | 8/2017 | Pokhriyal et al. |
| 2017/0309698 A1 | 10/2017 | Bower et al. |
| 2017/0373046 A1 | 12/2017 | Gardner et al. |
| 2018/0001614 A1 | 1/2018 | Bower et al. |
| 2018/0006107 A1 | 1/2018 | Cok |
| 2018/0151664 A1 | 5/2018 | Bower et al. |
| 2018/0166337 A1 | 6/2018 | Bower et al. |
| 2018/0204772 A1 | 7/2018 | Bower et al. |
| 2018/0254376 A1 | 9/2018 | Bower et al. |
| 2020/0227401 A1 | 7/2020 | Elsherbini et al. |

FOREIGN PATENT DOCUMENTS

| | | |
|---|---|---|
| KR | 10-1204347 B1 | 11/2012 |
| KR | 10-1493321 B1 | 2/2015 |
| KR | 20150024495 A | 3/2015 |
| KR | 20170096127 A | 8/2017 |
| KR | 10-2017-0101064 A | 9/2017 |
| WO | 2016/100657 A2 | 6/2016 |
| WO | 2016100662 A1 | 6/2016 |

OTHER PUBLICATIONS

Written Opinion issued Apr. 16, 2019 by the International Searching Authority in International Patent Application No. PCT/KR2019/000498. (PCT/ISA/237).
Search Report issued May 22, 2019 by the European Patent Office in counterpart European Patent Application No. 19153819.8.
Communication dated Jan. 24, 2020, issued by the European Patent Office in counterpart European Application No. 19153819.8.
Notice of Allowance (issuance date: Jul. 18, 2022) issued by the Korean Patent Office for Korean Patent Application No. 10-2018-0010895 which was filed on Jan. 29, 2018.

LIGHT EMITTING DIODE PANEL AND METHOD FOR MANUFACTURING THE LIGHT EMITTING DIODE PANEL

CROSS-REFERENCE TO THE RELATED APPLICATIONS

This application is a continuation application of U.S. application Ser. No. 16/251,816, filed Jan. 18, 2019, which is based on and claims priority under 35 U.S.C. § 119(a) to Korean Patent Application No. 10-2018-0010895, filed on Jan. 29, 2018, in the Korean Intellectual Property Office, the disclosures of which are incorporated by reference herein in their entirety.

BACKGROUND

1. Field

The disclosure relates to a display panel and a method for manufacturing same. More particularly, the disclosure relates to a light emitting diode (LED) panel and a method for manufacturing same.

2. Description of Related Art

Unlike liquid crystal display (LCD) panels, which display an image using a backlight and an LCD, LED panels illuminate LEDs and directly display an image without the need for a backlight layer or a liquid crystal layer. LED panels may use three LEDs respectively including a red (R) LED, a green (G) LED, and a blue (B) LED to constitute each pixel.

LED panels may be manufactured by bonding the respective R, G and B LEDs to a thin-film transistor (TFT) backplane for each type by a stamper. In this case, the respective R, G, and B LEDs are manufactured in different ways and have different thicknesses, whereas areas to which the respective LEDs are bonded on the related-art TFT backplane are formed to have the same height, which may be a problem.

For example, if the R LED is thinner than the G LED and the B LED, the relatively thin R LED may be easily broken into pieces as compared with the Green and B LEDs. If the R LED is bonded first (to the TFT backplane) and then, the G and B LEDs are bonded, the relatively thin R LED may receive interference of the stamper, etc. in the subsequent process (that is, process of bonding G and B LEDs), thus increasing the chances that the R LED will be broken. In addition, if the R LED is bonded the last to eliminate interference from the subsequent process, the R LED may be unbonded, and if a pressure of the stamper is increased too much to bond the R LED, the R LED may be broken into pieces.

The above information is presented as background information only to assist with an understanding of the disclosure. No determination has been made, and no assertion is made, as to whether any of the above might be applicable as prior art with regard to the disclosure.

SUMMARY

Provided are a light emitting diode (LED) panel which is formed such that LED bonding areas on the TFT backplane have different steps according to LED types, and a method for manufacturing the LED panel.

According to embodiments, a light emitting diode (LED) panel is provided. The LED panel includes a thin-film transistor (TFT) backplane including: an insulator film disposed on a top surface of a substrate; a plurality of organic films disposed on a top surface of the insulator film, the plurality of organic films having different heights from the top surface of the insulator film, each of the plurality of organic films being one among a transparent organic film, an opaque organic film, and a polymide; and pixel electrodes disposed on a top surface of each of the plurality of organic films. The LED panel further includes a plurality of LEDs respectively bonded to the pixel electrodes disposed on the top surface of each of the plurality of organic films, wherein the plurality of organic films has the different heights according to a type of each of the plurality of LEDs respectively bonded to the pixel electrodes disposed on the top surface of each of the plurality of organic films, wherein a thinnest LED among the plurality of LEDs is bonded to the pixel electrodes disposed on the top surface of organic film having a lowest height among the plurality of organic films, wherein an additional organic film is formed on an area between the pixel electrodes disposed on the top surface of each of the plurality of organic films, the additional organic film having a predetermined height from the top surface of each of the plurality of organic films, wherein the plurality of LEDs includes a first type LED, a second type LED, and a third type LED, and wherein the first type LED is thinner than either one or both of the second type LED and the third type LED.

According to one or more embodiments, the plurality of LEDs respectively corresponds to a plurality of sub pixels included in one pixel.

According to one or more embodiments, the plurality of organic films is a black matrix.

According to one or more embodiments, the one organic film is disposed at a predetermined height between the pixel electrodes disposed on the one organic film.

According to embodiments, a light emitting diode (LED) panel is provided. The LED panel includes a thin-film transistor (TFT) backplane including: an insulator film disposed on a top surface of a substrate; a plurality of organic films disposed on a top surface of the insulator film, the plurality of organic films having different heights from a top surface of the insulator film, each of the plurality of organic films being one among a transparent organic film, an opaque organic film, and a polymide; and pixel electrodes disposed on a top surface of each of the plurality of organic films. The LED panel further includes a plurality of LEDs respectively bonded to the pixel electrodes disposed on the top surface of each of the plurality of organic films, wherein the plurality of organic films has the different heights according to a type of each of the plurality of LEDs respectively bonded to the pixel electrodes disposed on the top surface of each of the plurality of organic films, wherein a thinnest LED among the plurality of LEDs is bonded to the pixel electrodes disposed on the top surface of organic film having a lowest height among the plurality of organic films, wherein an additional organic film is formed on an area between the pixel electrodes disposed on the top surface of each of the plurality of organic films, the additional organic film having a predetermined height from the top surface of each of the plurality of organic films, wherein the plurality of LEDs includes a first type LED, a second type LED, and a third type LED, and wherein the first type LED has a smallest thickness among the plurality of LEDs.

According to one or more embodiments, one LED having a smallest thickness among the plurality of LEDs is bonded to the pixel electrodes disposed on the top surface of one organic film having a smallest height among the plurality of organic films.

According to one or more embodiments, one among the plurality of organic films is disposed at a predetermined height between the pixel electrodes disposed on the one among the plurality of organic films.

According to various embodiments, problems of LED unbonding or LED crack that may occur due to a difference of thickness according to LED types in the process of bonding the LED to the TFT backplane can be minimized.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
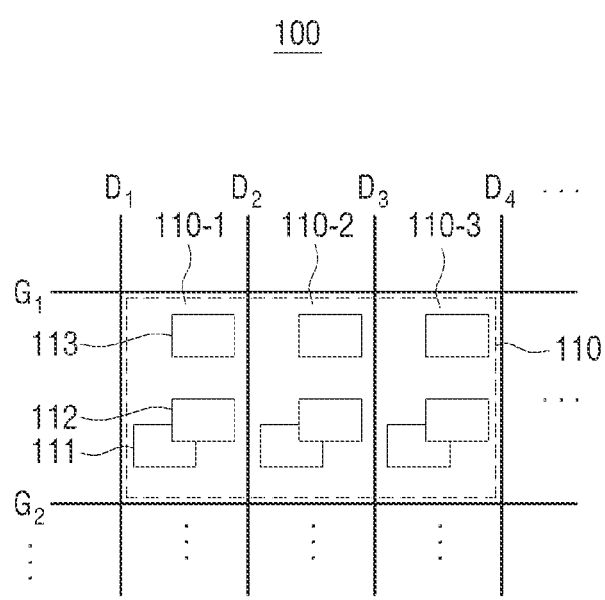
FIG. 1 is a diagram illustrating a pixel structure of a TFT backplane, according to an embodiment.

Specific embodiments are illustrated in the drawings and are described in detail in the detailed description. However, it is to be understood that the disclosure is not limited to a specific embodiment, but includes all modifications, equivalents, and substitutions without departing from the scope and spirit of the disclosure. In relation to explanation of the drawings, same or similar drawing reference numerals may be used for similar constituent elements.

Further, when it is mentioned that one element (e.g., first element) is operatively or communicatively coupled with or connected to another element (e.g., second element), it may be understood as including all the examples where each of the elements is directly coupled or indirectly coupled via yet another element (e.g., third element). When it is mentioned that one element (e.g., first element) is "directly coupled" with or "directly connected to" another element (e.g., second element), it may be understood that there is no element (e.g., third element) present between the element and the other element.

Herein, expressions such as "at least one of" when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The terms used in various embodiments of the disclosure are just for the purpose of describing particular embodiments and are not intended to limit the disclosure. In addition, the singular expression does not limit the disclosure to have a single component or step. Instead, the disclosure may comprise multiple components or steps even if described in singular expression.

All of the terms used herein including technical or scientific terms have the same meanings as those generally understood by a person of ordinary skill in the related art unless they are defined otherwise. The terms defined in a generally used dictionary should be interpreted as having the same meanings as the contextual meanings of the relevant technology and should not be interpreted as having ideal or exaggerated meanings unless they are clearly defined in the various embodiments. According to circumstances, even the terms defined in the embodiments should not be interpreted as excluding the embodiments of the disclosure.

Hereinafter, various embodiments of the disclosure will be described in detail with reference to the accompanying drawings.

FIG. 1 is a diagram illustrating a pixel structure of a thin-film transistor (TFT) backplane 100, according to an embodiment. As illustrated in FIG. 1, the TFT backplane 100 may have a structure in which a plurality of sub pixel areas 110-1, 110-2 and 110-3 defined by gate lines G1, G2, Gn and data lines D1, D2, Dn are arranged in a checkerboard form.

Here, the number of the plurality of sub pixel areas 110-1, 110-2 and 110-3 included in a single pixel area 110 is the same as the number of sub pixels per pixel (three in the example of FIG. 1). For example, the plurality of sub pixel areas 110-1, 110-2, and 110-3 may correspond to an R sub pixel, a G sub pixel, and a B sub pixel, respectively. In this case, an R LED, a G LED, and a B LED may be respectively bonded to the sub pixel areas 110-1, 110-2, and 110-3 and included in one pixel (or unit pixel) of the LED panel.

For example, the sub pixel area 110-1 may include at least one transistor 111 and two pixel electrodes 112 and 113. In FIG. 1, the two pixel electrodes 112 and 113 are implemented as a power electrode 112 and a common electrode 113, and one transistor 111 is provided only on the power electrode 112 side. However, according to embodiments, the two pixel electrodes may be respectively implemented as a power electrode and the two transistors may be provided on the respective sides of the two power electrodes. The remaining sub pixel areas 110-2 and 110-3 may be similarly arranged.

On the two pixel electrodes 112 and 113, the corresponding LED may be bonded and one sub pixel of the LED panel may be formed. Here, an area to which the LED is bonded on the TFT backplane 100 may be referred to as an LED bonding area. In this case, the TFT backplane 100 may be a structure in which a power is supplied to at least one of the two pixel electrodes 112 and 113 and the bonded LED emits light.

Figure 2:
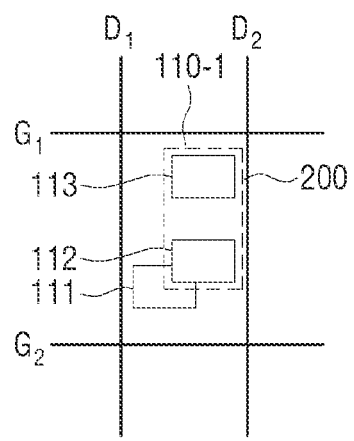
FIG. 2 is a diagram illustrating an LED bonding area on one sub pixel area included in the TFT backplane, according to an embodiment.

FIG. 2 illustrates an LED bonding area 200 on one sub pixel area 110-1 included in the TFT backplane 100. For example, one LED from among the R, G, and B LEDs may be bonded to the LED bonding area 200 to constitute one sub pixel of the LED panel.

The remaining sub pixel areas 110-2 and 110-3 may respectively include the LED bonding area as illustrated in FIG. 2 as well. Accordingly, the R, G and B LEDs may be respectively bonded to the LED bonding areas of the sub pixel areas 110-1, 110-2, and 110-3 to constitute one pixel of the LED panel.

As described above, the R, G, and B LEDs may be respectively manufactured in different ways, and thus the thicknesses thereof may be different. Accordingly, in a case that the LED bonding areas formed on the TFT backplane all have the same height, a problem in which the LED is unbonded or broken in the LED bonding process may occur.

According to an embodiment, the LED bonding areas included in the TFT backplane 100 may be formed on the TFT backplane 100 to have different heights according to types of LED to be bonded. In addition, a relatively thin LED may be bonded to an LED bonding area of a relatively low height from among the LED bonding areas to constitute an LED panel. By manufactured an LED panel this way, problems occurring in the LED bonding process according to the related art may be overcome.

The problems of the related art will be described in greater detail below with reference to FIGS. 3A, 3B, and 3C, and an LED panel manufacturing process according to an embodiment will be described with reference to FIGS. 4A and 4B.

Figure 3A:
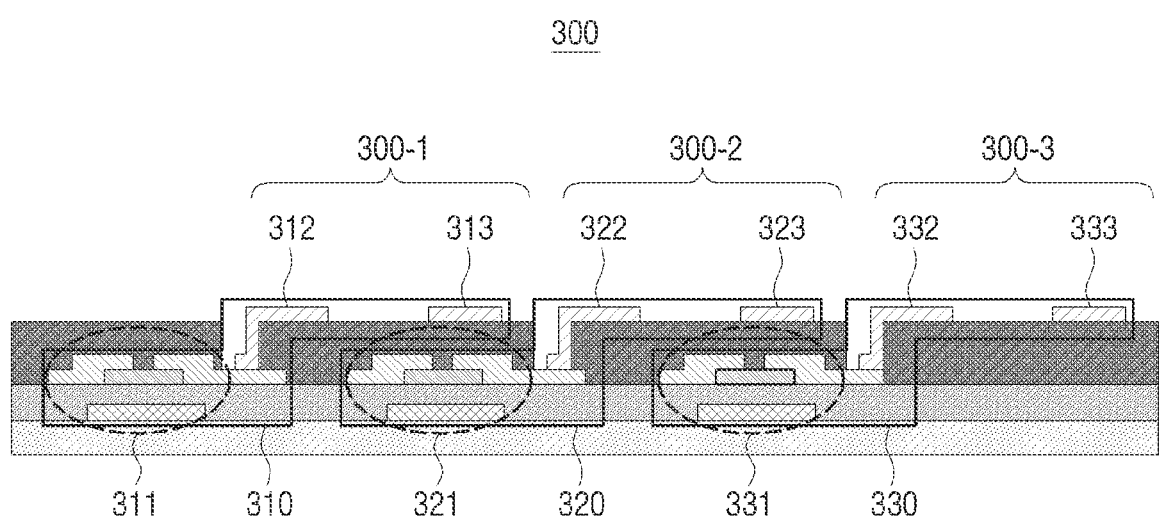
FIG. 3A is a diagram illustrating problems with a related art.
Figure 3B:
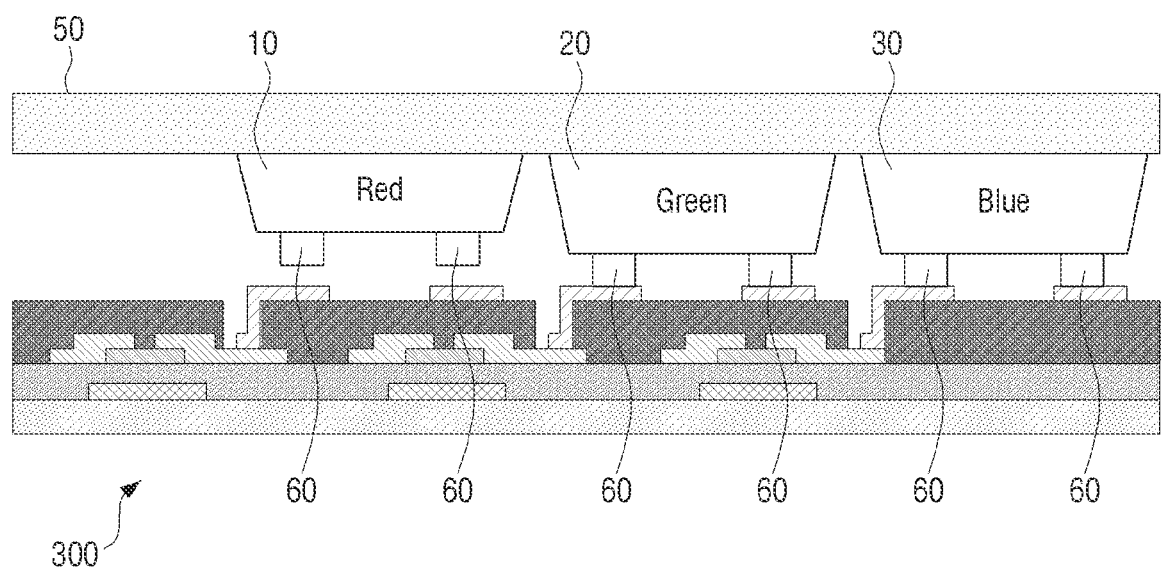
FIG. 3B is a diagram illustrating problems with a related art.
Figure 3C:
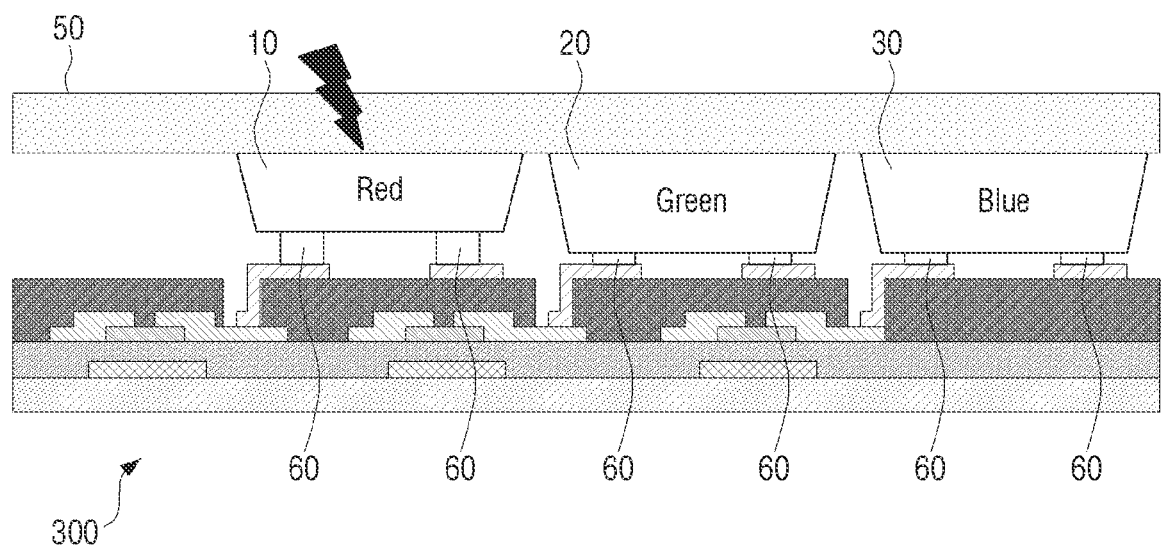
FIG. 3C is a diagram illustrating problems with a related art.

FIGS. 3A, 3B, and 3C are diagrams illustrating problems with a related art. FIG. 3A is a cross-sectional view of one pixel area included in a related-art TFT backplane 300.

As illustrated in FIG. 3A, one pixel area of the related-art backplane 300 may include three sub pixel areas 310, 320, and 330. The first sub pixel area 310 may include a transistor 311 and two pixel electrodes 312 and 313. The second sub pixel area 320 may include a transistor 321 and two pixel electrodes 322 and 323. The third sub pixel area 330 may include a transistor 331 and two pixel electrodes 332 and 333.

Here, the sub pixel areas 310, 320, and 330 may respectively include LED bonding areas 300-1, 300-2 and 300-3 to which an LED is bonded. As illustrated the respective LED bonding areas 300-1, 300-2, and 300-3 of the related-art TFT backplane 300 are formed at a uniform height regardless of types of LED to be bonded.

FIG. 3B illustrates a process of manufacturing an LED panel by bonding an LED onto the related-art TFT backplane 300. The LED panel may be manufactured by sequentially bonding an LED to the LED bonding areas 300-1 to 300-3 on the TFT backplane 300 using a stamper 50. In this case, the respective LEDs 10, 20, and 30 may be bonded onto the respective pixel electrodes 312/313, 322/323, and 332/333 in the LED bonding areas 300-1 to 300-3 through a metal bump 60 which is a conductive melting material.

As described above, a difference of thickness may be present among LEDs by type and thus, in a case that an LED is bonded to the LED bonding areas 300-1 to 300-3 of the related-art TFT backplane 300 of the same height, a problem may occur in the bonding process.

Referring to FIG. 3B, the R LED 10 is thinner than the G LED 20 and the B LED 30. This is due to a difference of LED epitaxial growth. For example, in a case that the R LED 20 uses gallium arsenide (GaAs) to proceed with the LED epitaxial growth process and that the G and B LEDs 20 and 30 use gallium nitride (GaN) to proceed with the LED epitaxial growth process, an ultimate thickness of the R LED 10 may be thin as compared with thicknesses of the G and B LEDs 20 and 30 as illustrated in FIG. 3B.

When bonding the respective R, G, and B LEDs to the TFT backplane 300, a bonding pressure of the stamper 50 remains unchanged and thus, in a case that the relatively thick G and B LEDs 20 and 30 are bonded first and then, the R LED 10 is bonded at the same bonding pressure, a problem that the relatively thin R LED 10 is unbonded may occur.

FIG. 3C illustrates a problem that may occur when a bonding pressure of a stamper is increased to resolve the unbonding problem of the R LED 10 as in FIG. 3B. The R LED 10 is fragile because it is thin and has weak properties. Accordingly, in a case that a stamper pressure is increased to bond the R LED 10, a crack may occur in the R LED 10 as illustrated in FIG. 3C. Although it is possible to set an appropriate stamper pressure at which the R LED 100 is bonded without cracking, it is not easy to find the appropriate stamper pressure, and even if the pressure is changed only slightly, an unbonding or cracking of the R LED may occur.

In order to try and solve these problems, boning the R LED 10 first and then, bounding the G and B LEDs 20 and 30 has been considered in the related art. However, this may increase the chances that the bonded R LED 10 will be interrupted in the subsequent process, that is, the process of bonding the G LED 20 and the B LED 30, which is not desirable.

In contrast, according to an embodiment, the LED bonding area of the TFT backplane may be formed at different heights according to a type of an LED to be bonded, and the relatively thin LED may be bonded to the LED bonding area at a relatively low height to manufacture an LED panel, and thereby the problem described above may be overcome.

Figure 4A:
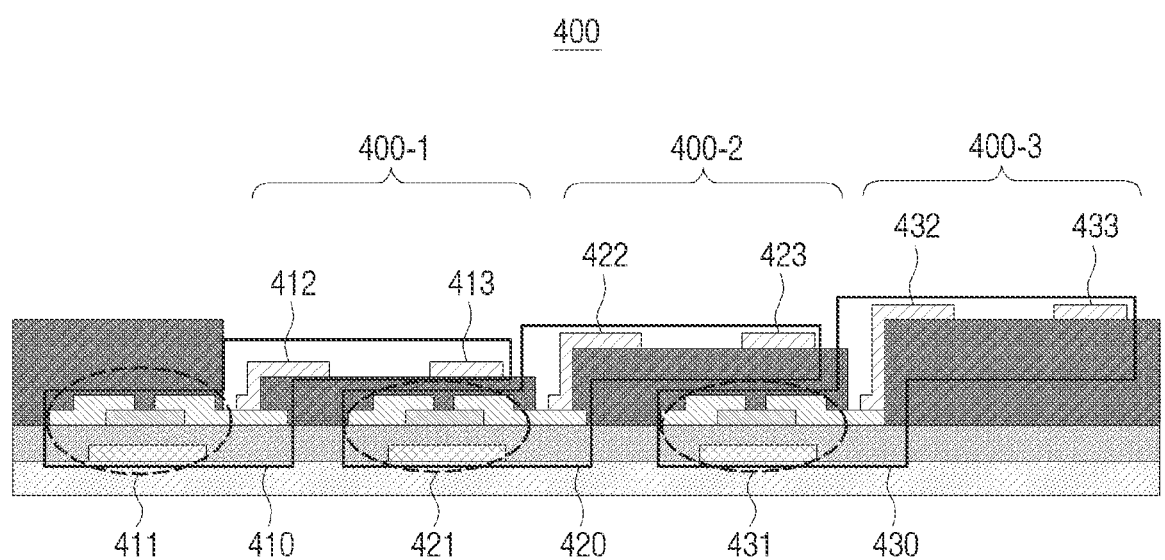
FIG. 4A is a diagram illustrating a method for manufacturing an LED panel, according to various embodiments.
Figure 4B:
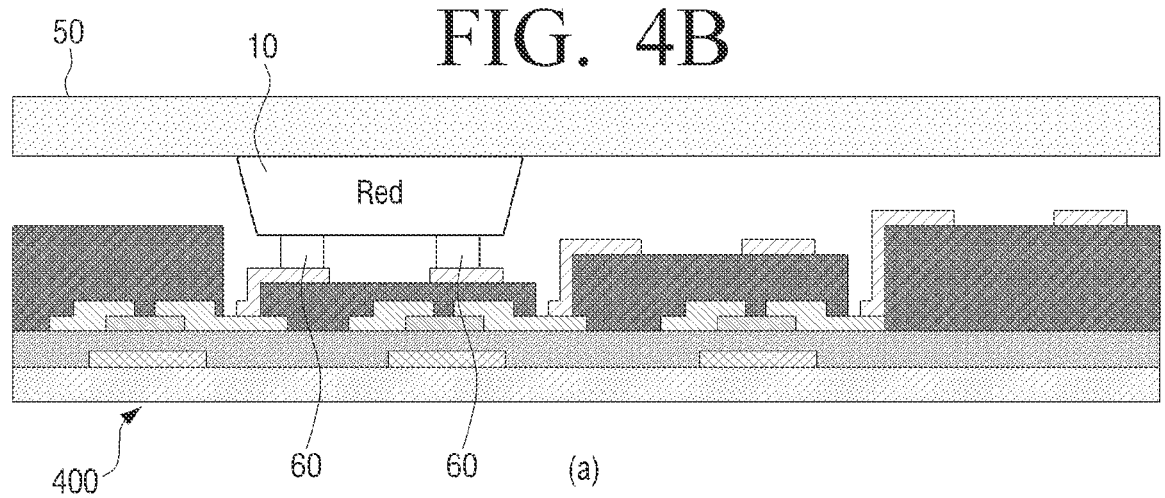
FIG. 4B is a diagram illustrating a method for manufacturing an LED panel, according to various embodiments.
Figure 4B:
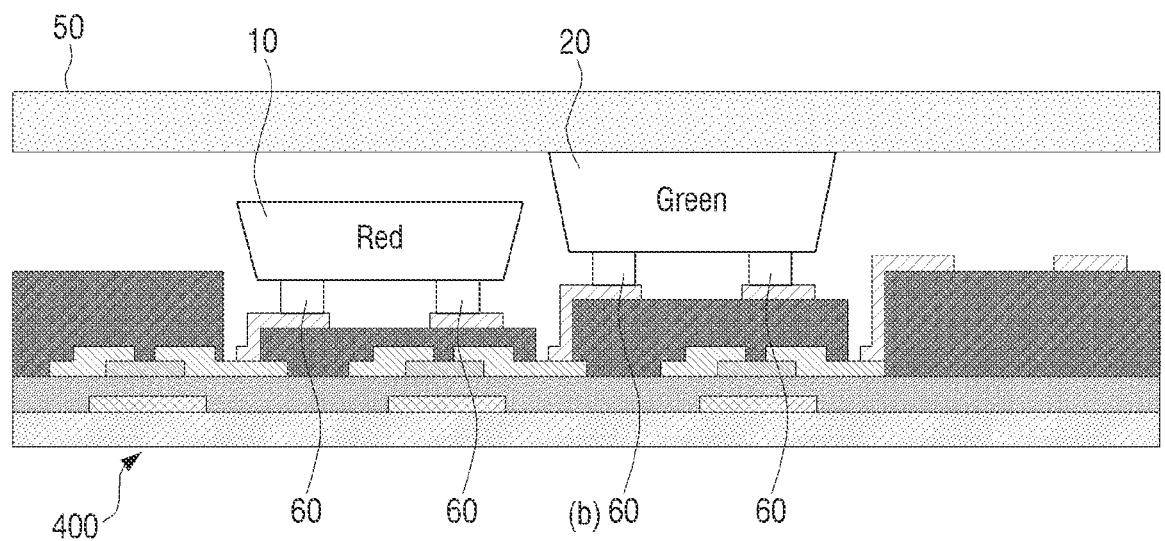
Figure 4B:
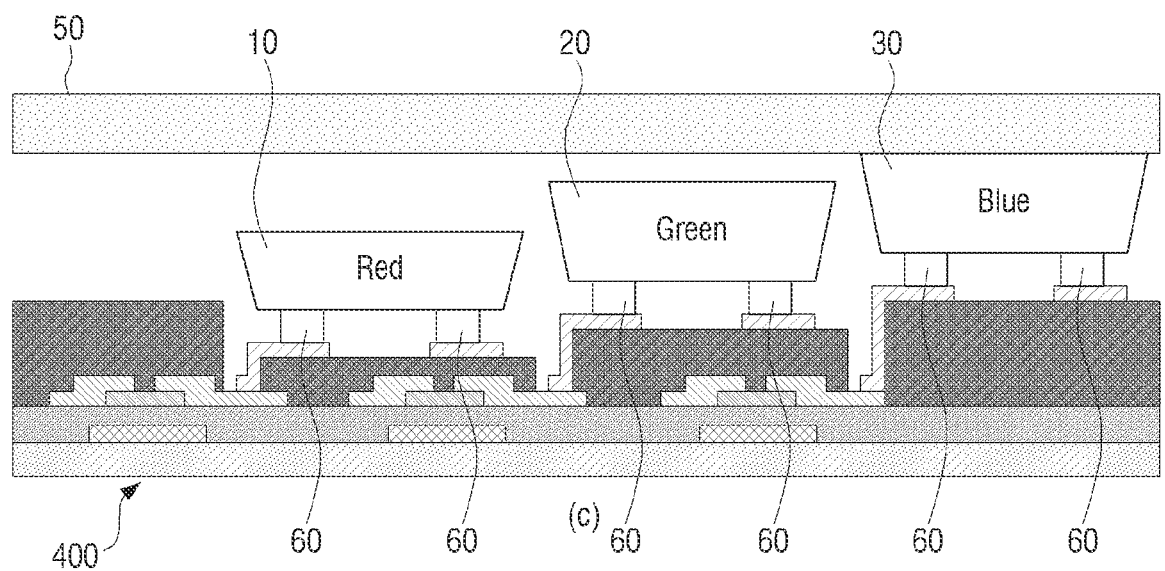

FIGS. 4A and 4B are diagrams illustrating a method for manufacturing an LED panel, according to various embodiments.

FIG. 4A is a cross-sectional view of one pixel area included in the TFT backplane, according to an embodiment. As illustrated in FIG. 4A, one pixel area of the TFT backplane 400 according to an embodiment may include three sub pixel areas 410, 420, and 430, and the respective sub pixel areas 410, 420, and 430 may include one transistor 411, 421, and 431 and two pixel electrodes 412/413, 422/423, and 432/433. In this case, the respective pixel electrodes may include an anode electrode 412, 422 and 432, and a cathode electrode 413, 423, and 433.

In the TFT backplane 400 according to an embodiment, the LED bonding heights 400-1, 400-2, and 400-3 may be formed at different heights unlike the related-art TFT backplane 300 of FIG. 3A. For example, the LED bonding area 400-1 may be formed at the lowest level, the LED bonding area 400-2 may be formed at the intermediate level, and the LED bonding area 400-3 may be formed at the highest level among the bonding areas.

However, embodiments are not limited to any specific examples. That is, when it is assumed that heights of the LED bonding areas 400-1, 400-2, and 400-3 on the TFT backplane 400 are respectively represented as A, B, and C, it may be formed as shown in A<B<C as illustrated in FIG. 4A, but may be, in an implementation, as shown in A<B=C, A=B>C, or A>B>C.

FIG. 4B illustrates a process of manufacturing an LED panel by bonding R, G, and B LEDs onto the LED bonding areas 400-1 to 400-3 of the TFT backplane.

For example, according to an embodiment, a relatively thin LED from among a plurality of LEDs may be bonded to an LED bonding area of a relatively low level from among the plurality of LED bonding areas.

For example, while thicknesses of the R, G, and B LEDs 10, 20, and 30 are represented as a, b, and c, respectively, when it is assumed that a<b=c, or that a<b<c, a relatively thin R LED 10 may, as illustrated in section (a) of FIG. 4B, may be bonded to the LED bonding area 400-1, and the G LED 20 and the B LED 30 may be sequentially bonded to the LED bonding areas 400-2 and 400-3, respectively, as illustrated in sections (b) and (c) of FIG. 4B.

In FIG. 4B, when it is assumed that the heights of the LED bonding areas 400-1, 400-2, and 400-3 are represented as A, B, and C, respectively, the TFT backplane 400 is formed such that A<B<C as illustrated in FIG. 4A, but is not limited thereto. For example, even in a case of a TFT backplane in which the heights of the LED bonding areas 400-1 to 400-3 have a relationship of A<B=C, as illustrated in FIG. 4B, the R, G, and B LEDs 10, 20, and 30 may be sequentially bonded to the corresponding LED bonding area.

In a case of a TFT backplane on which the LED bonding areas 400-1 to 400-3 have heights of a relationship of A=B>C, or A>B>C, unlike FIG. 4B, the relatively thinnest R LED 10 may be bonded to the LED bonding area 400-3 of the relatively lowest level, and the G LED 20 and the B LED 30 may be sequentially bonded to the LED bonding area 400-2 and the LED bonding area 400-1, respectively.

According to the various embodiments, the LED bonding areas 400-1, 400-2 and 400-3 included in the TFT backplane 400 may be formed at different heights according to a type of LED to be bonded thereto, and a relatively thin LED may be bonded to an LED bonding area of a relatively low height, thus eliminating the possibility of interference by the stamper 50 in the LED bonding process. Accordingly, an LED bonding defect or an LED cracking problem by a stamper pressure can be resolved.

With regard to the planar view of the TFT backplane 400 illustrated in FIGS. 4A and 4B, the transistors 411, 421 and 431 are different in position from those of FIG. 1, but this is only a difference in an implementation which is irrelevant to the gist of the disclosure.

In the example described above, the R, G, and B LEDs 10, 20 and 30 are included in one pixel, and when it is assumed that the thicknesses of the LEDs are represented as a, b, and c, respectively, the relationship thereof are a<b=c or a<b<c. However, the example is not limited thereto. For example, one pixel of the LED panel may include three or more LEDs, and a relationship among the respective LEDs may differ depending on LED manufacturing processes.

That is, a type and the number of LEDs included in one pixel of an LED panel, and a relationship of thicknesses between LEDs may differ according to embodiments. However, if a relatively thin LED is bonded to the LED bonding area 400-1 of a relatively low level, the case may be included in the technical concept of the disclosure.

The description of other processes required for manufacturing an LED panel is omitted herein because they would obscure the gist of the disclosure.

A method for manufacturing a TFT backplane according to an embodiment will be described below. FIGS. 5A, 5B, 5C, 5D are diagrams sequentially illustrating a method for manufacturing a TFT backplane 500, according to various embodiments. FIGS. 5A, 5B, 5C, and 5D illustrate a process of generating one pixel area including three sub pixel areas in the TFT backplane 500.

Figure 5A:
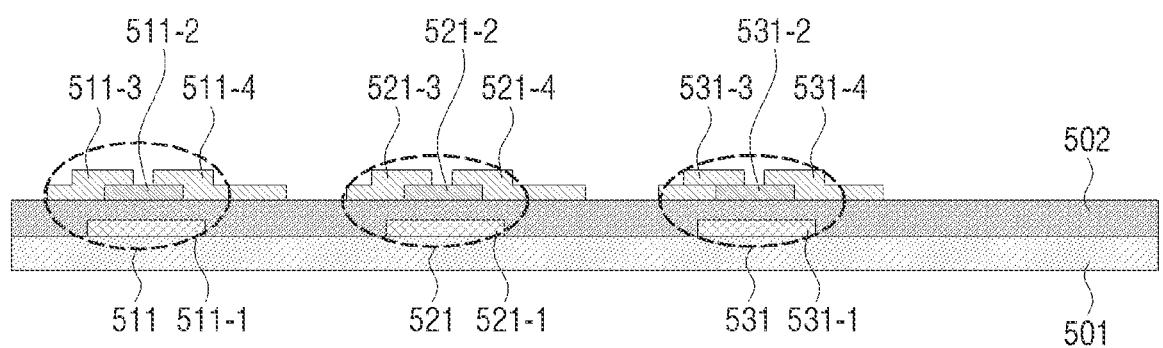
FIG. 5A is a diagram illustrating a method for manufacturing a TFT backplane, according to various embodiments.

A process of manufacturing the TFT backplane 500, which is also referred to as a TFT substrate, a TFT array, or a TFT panel, may first include forming TFTs 511, 521, and 531 respectively corresponding to sub pixels as illustrated in FIG. 5A, through a related-art TFT process.

For example, the respective TFTs 511, 521, and 531 may be manufactured by a TFT process sequentially including forming gate electrodes 511-1, 521-1 and 531-1 on the substrate 501, forming an insulator film 502 and semiconductor films 511-2, 521-2, and 531-2 on the gate electrodes 511-1, 521-1, and 531-1, and then forming source electrodes 511-3, 521-3, and 531-3 and drain electrodes 511-4, 521-4, and 531-4.

In this case, the substrate 501 may be implemented as a glass. However, depending on circumstances, polyimide, polyethylene terephthalate (PET), etc. may be used. In addition, the semiconductor films 511-2, 521-2, and 531-2 may be made of at least one material of amorphous silicon (a-Si), low-temperature poly silicon (LTPS), and oxide.

The gate electrodes 511-1, 521-1, and 531-1 formed on the substrate 501 may function to control a current to flow or not to flow in the semiconductor films 511-2, 521-2, and 531-2, and the insulator film 502 may serve to separate the semiconductor films 511-2, 521-2 and 531-2. In addition, the source electrodes 511-3, 521-3, and 531-3 and the drain electrodes 511-4, 521-4, and 531-4 may function as a data electrode which supplies and receives electrons through the semiconductor films 511-2, 521-2, and 531-2.

The respective TFTs 511, 521, and 531 may serve as a sort of switch controlling a light emission intensity, light emission time, etc. of the corresponding LED. FIG. 5A illustrates, by way of example, the TFT having an inverted staggered structure, but the embodiment is not limited thereto. As another example, the TFT having a staggered structure, a coplanar structure, an inverted coplanar structure, or the like may also be used.

Figure 5B:
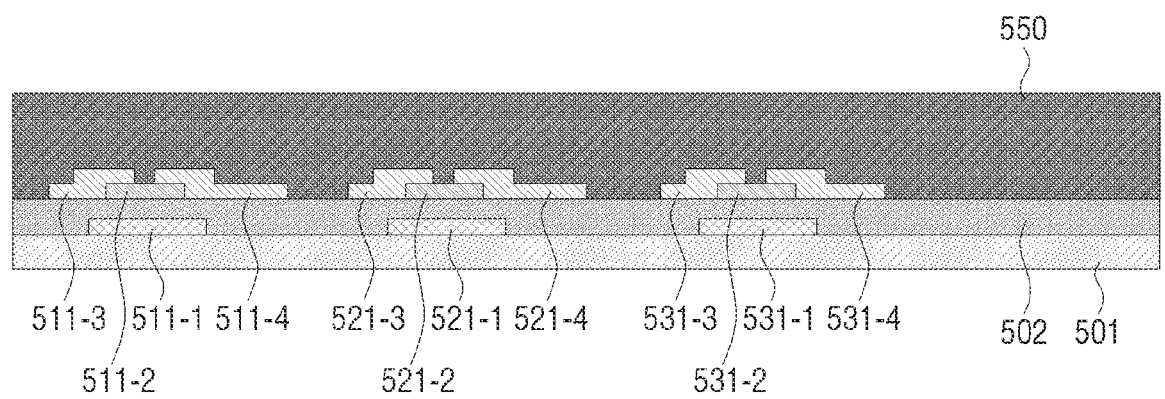
FIG. 5B is a diagram illustrating a method for manufacturing a TFT backplane, according to various embodiments.

When the TFTs 511, 521, and 531 respectively corresponding to the sub pixels are provided, as illustrated in FIG. 5B, an organic layer 550 may be formed on the data electrodes (that is, the source electrodes 511-3, 521-3, and 531-3) and the drain electrodes 511-4, 521-4, and 531-4.

For example, the organic film 550 may be evenly coated on the data electrodes. In general, a deposition process and a coating process may be used to form an insulator film or an organic film layer. However, according to an embodiment, it is necessary that the LED bonding areas are formed at different heights as described above, and thus it is desirable to form the organic film 550 through the coating process rather than through the deposition process.

A photosensitive material, that is, photo resist (PR), may be used for the organic film 550. In this regard, a variety of acrylic materials may be used for the organic film 550. For example, a transparent organic film (e.g., transparent organic layer material used in a manufacturing process of related-art LCD panels), an opaque organic film (e.g., black matrix), or Polyimide may be used.

The various embodiments relate to an LED panel directly displaying an image by illuminating an LED, and thus it is desirable to form an opaque organic film (black matrix) on a data electrode to prevent a light emitted from an LED from being reflected off the TFT backplane 500. This is clearly different from forming a black matrix layer on a color filter in the LCD panel manufacturing process in terms of objective and effect. However, the example is not limited thereto, and depending on circumstances, an organic film such as a transparent organic film and Polyimide may be used as well.

Figure 5C:
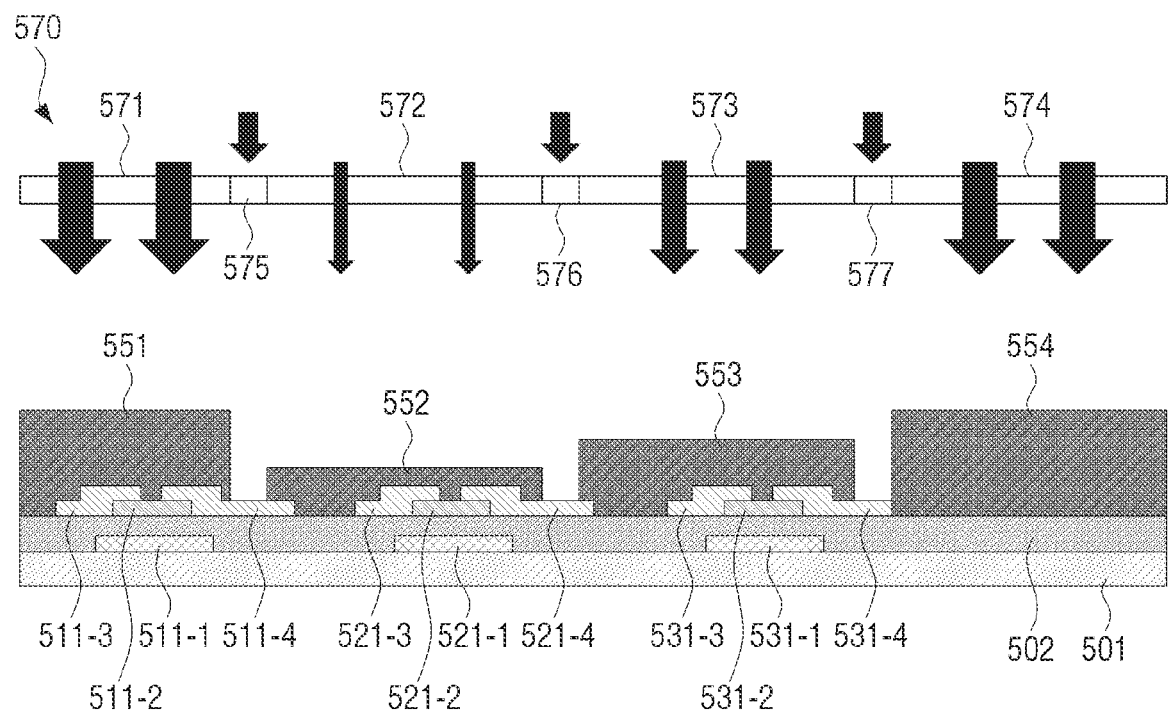
FIG. 5C is a diagram illustrating a method for manufacturing a TFT backplane, according to various embodiments.

When a TFT substrate with which the organic film 550 is flat-coated is provided, as illustrated in FIG. 5C, a light is radiated to the organic film 550 through a mask 570 having areas with different penetration ratios so that the LED bonding areas 552, 553, and 554 are formed at different heights according to a type of LED to be bonded thereto.

As described above, a Photo Resist is used for the organic film 550, and thus, when a light is radiated to the organic film 550 through the mask 570 having the areas 571 to 577 with different penetration ratios, an intensity of light radiated to the organic film 550 changes according to penetration ratios and thus, based on a penetration ratio of the respective parts 571 to 577, the corresponding organic film 550 may be formed at different heights.

FIG. 5C illustrates a case in which the organic film 550 is a negative Photo Resist. The negative Photo Resist refers to a material which is removed much during development as the radiated light is weak. FIG. 5C illustrates a mask 570 that includes, for example, areas 571 and 574 with a 100% penetration ratio, an area 573 with a 70% penetration ratio, an area 572 with a 50% penetration ratio, and areas 575, 576, and 577 with a 0% penetration ratio.

Accordingly, when the light is radiated through the mask 570 and developed, the organic film 550 may not be removed from the parts of organic films 551 and 554 corresponding to the areas 571 and 574, may be removed from the part of organic film 553 corresponding to the area 573, and further removed from the part of organic film 552 corresponding to the area 572. In this sequence, the organic film is formed at a gradually lower height. No light may be radiated to organic film parts corresponding to areas 575, 576, and 577, and thus it may be identified that the entire organic film 550 is removed.

In FIG. 5C, the organic film 550 is a negative Photo Resist. However, a positive Photo Resist which is removed much during development as a light radiation increases may be used as an organic film.

Figure 5D:
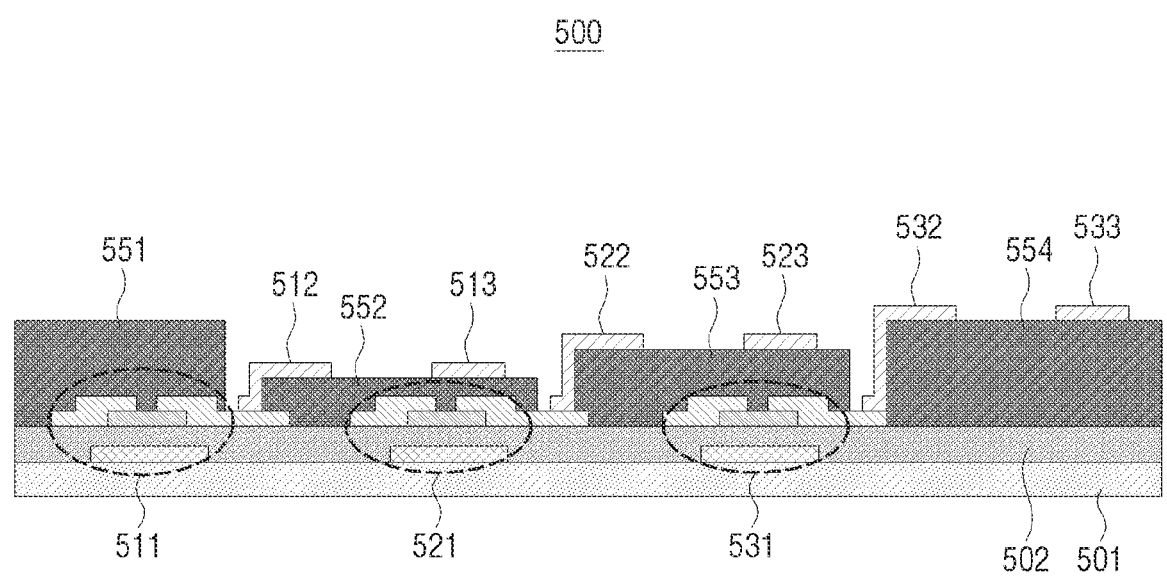
FIG. 5D is a diagram illustrating a method for manufacturing a TFT backplane, according to various embodiments.

As described above, a light is radiated through the mask 570 with different penetration ratios and the organic films 552, 553, and 554 is formed at different heights for each LED bonding area, as illustrated in FIG. 5D, the pixel electrodes 512/513, 522/523, and 532/533 may be respectively formed on the organic films 552, 553, and 554 formed at different heights, thereby manufacturing the TFT backplane 500 according to an embodiment. In this case, the respective pixel electrodes may include an anode electrode 512, 522, and 532, and a cathode electrode 513, 523, and 533.

Figure 6A:
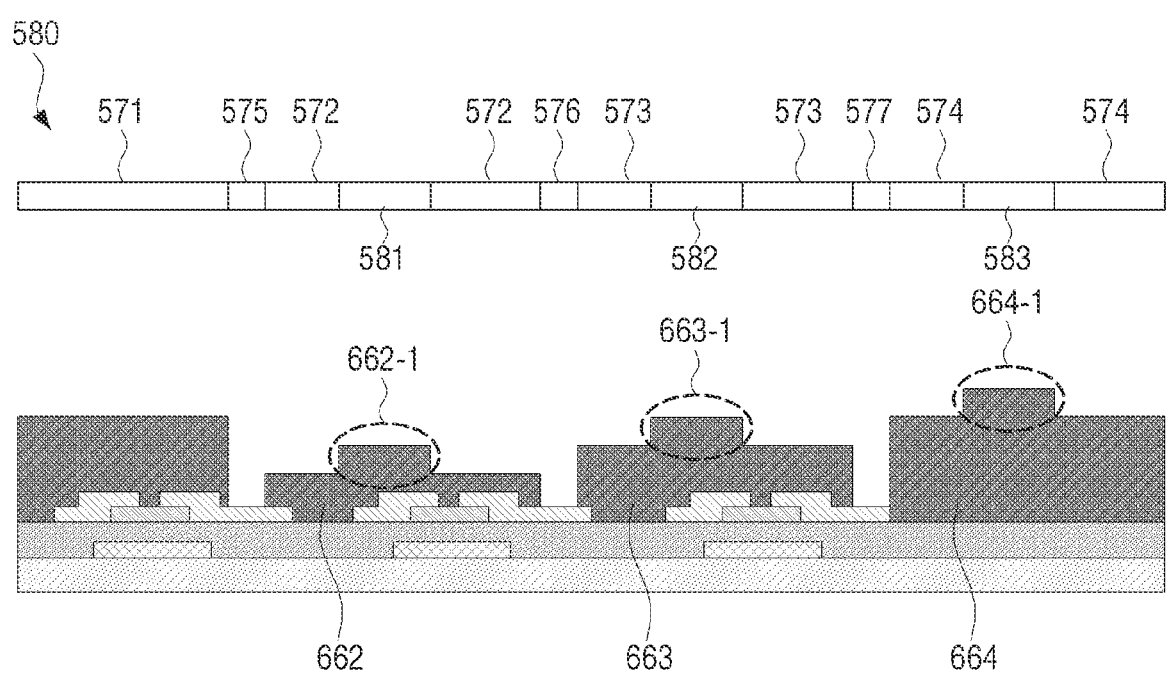
FIG. 6A is a diagram illustrating an embodiment for preventing a short-circuit of anode and cathode terminals when an LED is bonded to the TFT backplane.
Figure 6B:
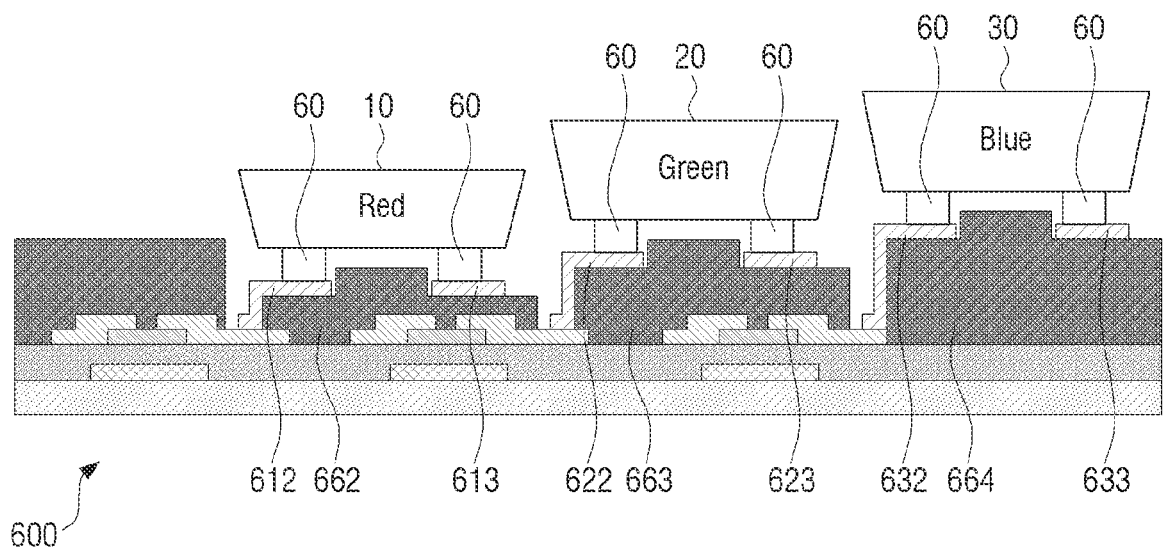
FIG. 6B is a diagram illustrating an embodiment for preventing a short-circuit of anode and cathode terminals when an LED is bonded to the TFT backplane.
Figure 6C:
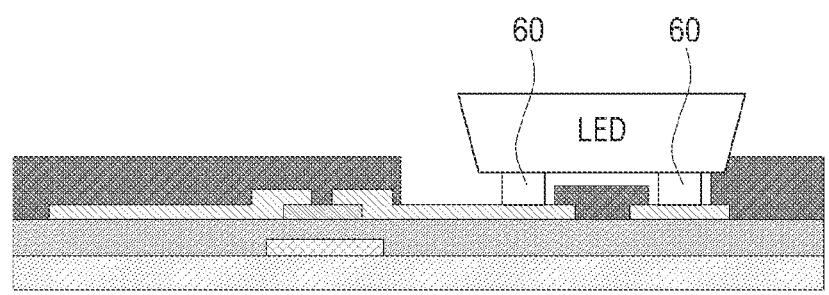
FIG. 6C is a diagram illustrating an embodiment for preventing a short-circuit of anode and cathode terminals when an LED is bonded to the TFT backplane.

FIGS. 6A, 6B, and 6C are diagrams illustrating an embodiment for preventing anode and cathode terminals from being short-circuited when an LED is bonded to the TFT backplane.

According to an embodiment, an LED bonding area of a TFT backplane may further include an organic film of a predetermined height between two pixel electrodes (anode and cathode).

As described above, onto the two pixel electrodes, the corresponding LED may be bonded so that one sub pixel of an LED panel may be formed. That is, the anode/cathode terminals of the LED may be respectively bonded to the anode/cathode terminals of the pixel electrode. However, in this case, the LED included in one sub pixel of the LED panel is very small in size, and thus it is likely that a short-circuit will occur between the anode terminal and the cathode terminal.

Accordingly, an organic film of a predetermined height may be formed between the anode terminal and the cathode terminal on the LED bonding area, and thereby a short-circuit of the anode and cathode terminals during LED bonding can be prevented.

FIG. 6A illustrates a method for further forming an organic film of a predetermined height between two pixel electrodes included in the respective LED bonding areas. As described with reference to FIG. 5C, a light may be radiated to the organic film (photo resist) through a mask including areas with different penetration ratios, thereby forming an organic film of different heights on the TFT backplane.

Accordingly, as illustrated in FIG. 6A, penetration ratios of the areas 581, 582, and 583 of the mask 580 corresponding to an area between positions at which the two pixel electrodes are to be formed on the TFT backplane may be appropriately selected to thereby respectively form the organic films 662, 663, and 664 further including the parts of organic film 662-1, 663-1, and 664-1 of predetermined heights between the positions at which the two pixel electrodes are to be formed.

Thereafter, the pixel electrodes 612/613, 622/623, and 632/633 may be respectively formed on the organic film 662, 663, and 664 corresponding to the LED bonding area may be formed, and thereby, as illustrated in FIG. 6B, a TFT backplane 600 further including an organic film of a predetermined height between the two pixel electrodes 612/613, 622/623, and 632/633 may be manufactured.

In this case, as illustrated in FIG. 6B, even in a case that the LEDs 10, 20 and 30 are respectively bonded to the pixel electrodes 612/613, 622/623, and 632/633 through a metal bump 60 which is a conductively melting material, a short-circuit between the pixel electrodes 612/613, 622/623, and 632/633 can be prevented.

In FIGS. 6A and 6B, an organic film of a predetermined height is further included in between two pixel electrodes included in the TFT backplane having LED bonding areas with different steps according to a type of LED to be bonded thereto, but the example is not limited thereto. That is, as illustrated in FIG. 6C, an organic film of a predetermined height may be formed between pixel electrodes included in a related-art TFT backplane having LED bonding areas without steps, and thereby it is possible to prevent a short-circuit between pixel electrodes that may occur during LED bonding.

In the example above, a case in which a TFT backplane includes an additional pixel electrode is described. However, the technical concept according to the various embodiments is not limited thereto. For example, the technical concept of the disclosure may be applicable to a case in which a TFT backplane 700 directly using a source/drain (SD) layer as a pixel electrode, that is, anode/cathode terminals, as illustrated in FIG. 7.

Figure 7:
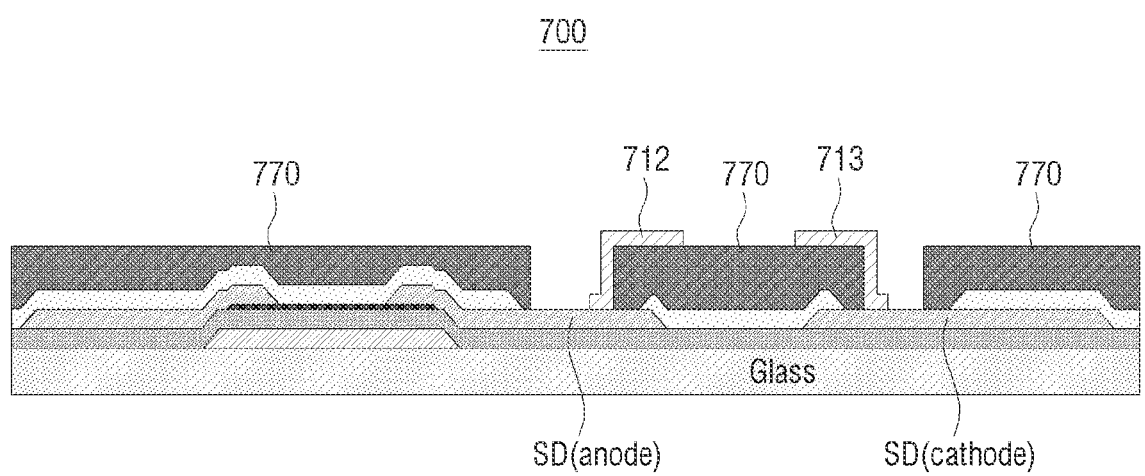
FIG. 7 is a diagram illustrating a TFT backplane, according to another embodiment.

Even in a case in which the source/drain (SD) layer is directly used as anode/cathode terminals as illustrated in FIG. 7, the organic film 770 may be coated on top of the SD layer and the light may be radiated through a mask including areas with different penetration ratios, and thereby an organic film with different heights for each LED bonding area may be formed. Accordingly, by forming an additional pixel electrode 712 and 713 on the organic film of different heights, it is possible to manufacture a TFT backplane with different heights according to a type of LED to be bonded thereto. In FIG. 7, for convenience of explanation, only one sub pixel area is illustrated. However, an LED bonding area included in surrounding another sub pixel area may be formed at different heights from the organic film 770.

Hereinabove, an LED, an organic LED (OLED), a micro LED, etc. may be bonded to the LED bonding area, but the example is not limited thereto.

As described above, according to the various embodiments, problems of LED unbonding or LED cracking that may occur due to a difference of thickness according to LED types in the process of bonding the LED to the TFT backplane can be minimized.

The foregoing embodiments and advantages are merely example and are not to be construed as limiting the disclosure. The present teaching can be readily applied to other types of apparatuses. Also, the description of the embodiments is intended to be illustrative, and not to limit the scope of the claims, and many alternatives, modifications, and variations will be apparent to persons having ordinary skill in the art.

What is claimed is:

1. A light emitting diode (LED) panel comprising: a thin-film transistor (TFT) backplane comprising:
    an insulator film disposed on a top surface of a substrate;
    a plurality of organic films disposed on a top surface of the insulator film, the plurality of organic films having different heights from the top surface of the insulator film, each of the plurality of organic films being one among a transparent organic film, an opaque organic film, and a polyimide; and
    pixel electrodes disposed directly on a top surface of each of the plurality of organic films; and
    a plurality of LEDs respectively bonded to the pixel electrodes disposed on the top surface of each of the plurality of organic films,
    wherein the plurality of organic films has the different heights according to a type of each of the plurality of LEDs respectively bonded to the pixel electrodes disposed on the top surface of each of the plurality of organic films,
    wherein a thinnest LED among the plurality of LEDs is bonded to the pixel electrodes disposed on the top surface of the organic film having a lowest height among the plurality of organic films,
    wherein an additional organic film is only formed on an area between the pixel electrodes disposed on the top surface of each of the plurality of organic films, the additional organic film having a predetermined height from the top surface of each of the plurality of organic films,
    wherein the plurality of LEDs comprises a first type LED, a second type LED, and a third type LED, and
    wherein the first type LED is thinner than either one or both of the second type LED and the third type LED.

2. The LED panel as claimed in claim 1, wherein the plurality of LEDs respectively corresponds to a plurality of sub pixels included in one pixel.

3. The LED panel as claimed in claim 1, wherein the plurality of organic films is a black matrix.

4. The LED panel as claimed in claim 1, wherein the one organic film is disposed at a predetermined height between the pixel electrodes disposed on the one organic film.

5. A light emitting diode (LED) panel comprising:
    a thin-film transistor (TFT) backplane comprising:
    an insulator film disposed on a top surface of a substrate;
    a plurality of organic films disposed on a top surface of the insulator film, the plurality of organic films having different heights from a top surface of the insulator film, each of the plurality of organic films being one among a transparent organic film, an opaque organic film, and a polyimide; and
    pixel electrodes directly disposed on a top surface of each of the plurality of organic films; and
    a plurality of LEDs respectively bonded to the pixel electrodes disposed on the top surface of each of the plurality of organic films,
    wherein the plurality of organic films has the different heights according to a type of each of the plurality of LEDs respectively bonded to the pixel electrodes disposed on the top surface of each of the plurality of organic films,
    wherein a thinnest LED among the plurality of LEDs is bonded to the pixel electrodes disposed on the top surface of organic film having a lowest height among the plurality of organic films,
    wherein an additional organic film is only formed on an area between the pixel electrodes disposed on the top surface of each of the plurality of organic films, the additional organic film having a predetermined height from the top surface of each of the plurality of organic films,
    wherein the plurality of LEDs comprises a first type LED, a second type LED, and a third type LED, and
    wherein the first type LED has a smallest thickness among the plurality of LEDs.

6. The LED panel as claimed in claim 5, wherein one LED having a smallest thickness among the plurality of LEDs is bonded to the pixel electrodes disposed on the top surface of one organic film having a smallest height among the plurality of organic films.

7. The LED panel as claimed in claim 5, wherein one among the plurality of organic films is disposed at a predetermined height between the pixel electrodes disposed on the one among the plurality of organic films.

* * * * *